(12) United States Patent
Sakamoto et al.

(10) Patent No.: US 8,908,373 B2
(45) Date of Patent: Dec. 9, 2014

(54) COOLING STRUCTURE FOR AN ELECTRONIC COMPONENT AND ELECTRONIC INSTRUMENT

(75) Inventors: Hitoshi Sakamoto, Tokyo (JP); Chenpin Hsu, Tokyo (JP)

(73) Assignee: NEC Corporation, Tokyo (JP)

( * ) Notice: Subject to any disclaimer, the term of this patent is extended or adjusted under 35 U.S.C. 154(b) by 287 days.

(21) Appl. No.: 13/498,892

(22) PCT Filed: Sep. 16, 2010

(86) PCT No.: PCT/JP2010/066050
§ 371 (c)(1),
(2), (4) Date: Mar. 28, 2012

(87) PCT Pub. No.: WO2011/040253
PCT Pub. Date: Apr. 7, 2011

(65) Prior Publication Data
US 2012/0193076 A1 Aug. 2, 2012

(30) Foreign Application Priority Data

Sep. 30, 2009 (JP) ................ P2009-226148

(51) Int. Cl.
*H05K 7/20* (2006.01)
*H01L 23/427* (2006.01)
*H01L 23/40* (2006.01)

(52) U.S. Cl.
CPC ....... *H01L 23/427* (2013.01); *H01L 2023/4056* (2013.01); *H01L 2023/4081* (2013.01)
USPC ........................ 361/700; 361/699; 361/707; 361/719; 174/15.2; 174/16.3; 165/80.3;165/80.4; 165/104.26

(58) Field of Classification Search
None
See application file for complete search history.

(56) References Cited

U.S. PATENT DOCUMENTS

| | | | |
|---|---|---|---|
| 5,592,363 A | 1/1997 | Atarashi et al. | |
| 5,870,287 A | 2/1999 | Rodriguez et al. | |
| 5,880,524 A * | 3/1999 | Xie | 257/704 |
| 6,625,022 B2 * | 9/2003 | Frutschy et al. | 361/700 |
| 6,631,077 B2 * | 10/2003 | Zuo | 361/699 |
| 6,639,799 B2 * | 10/2003 | Prasher et al. | 361/700 |

(Continued)

FOREIGN PATENT DOCUMENTS

| | | |
|---|---|---|
| JP | 3002611 B2 | 1/2000 |
| JP | 2002-516031 A | 5/2002 |

(Continued)

OTHER PUBLICATIONS

International Search Report in PCT/JP2010/066050 dated Dec. 14, 2010(English Translation Thereof).

*Primary Examiner* — Boris Chervinsky
(74) *Attorney, Agent, or Firm* — McGinn IP Law Group, PLLC (57) ABSTRACT

A metal plate that forms a heat-absorbing surface has a center portion which protrudes so as to correspond to the size of a semiconductor element. A fixing support point of a plate spring is provided at a center of this protruding surface, and the plate spring is fixed on all sides. Grounding pressure is applied via the single point provided by the fixing support point. As a result, any tilting of the heat-absorbing surface relative to the surface of the heat-generating element is kept to a minimum. Heat pipes are provided around the periphery such that they enclose the protruding area from the outside.

16 Claims, 6 Drawing Sheets

(56) References Cited

U.S. PATENT DOCUMENTS

| | | | |
|---|---|---|---|
| 6,761,813 B2 * | 7/2004 | Xu | 205/114 |
| 6,822,867 B2 * | 11/2004 | Hsieh | 361/704 |
| 6,841,867 B2 * | 1/2005 | Matayabas et al. | 257/706 |
| 7,007,741 B2 * | 3/2006 | Sen et al. | 165/46 |
| 7,375,963 B2 * | 5/2008 | Eckberg et al. | 361/704 |
| 7,518,868 B2 * | 4/2009 | Farrow et al. | 361/700 |
| 7,708,583 B2 * | 5/2010 | Ma | 439/485 |
| 7,855,889 B2 * | 12/2010 | Hung et al. | 361/700 |
| 8,176,972 B2 * | 5/2012 | Mok | 165/46 |
| 8,422,218 B2 * | 4/2013 | Fried et al. | 361/679.47 |
| 2008/0123298 A1 | 5/2008 | Takeguchi et al. | |
| 2010/0103619 A1 * | 4/2010 | Refai-Ahmed et al. | 361/701 |

FOREIGN PATENT DOCUMENTS

| | | |
|---|---|---|
| JP | 2005-079376 A | 3/2005 |
| JP | 2007-149855 A | 6/2007 |
| JP | 2008-130037 A | 6/2008 |
| WO | WO98/35540 | 8/1998 |

* cited by examiner

COOLING STRUCTURE FOR AN ELECTRONIC COMPONENT AND ELECTRONIC INSTRUMENT

TECHNICAL FIELD

The present invention relates to the cooling of an electronic component such as a semiconductor device and, in particular, to a cooling structure for an electronic component that is aimed at devices which are constructed from packaged semiconductor chips, and to an electronic component.

Priority is claimed on Japanese Patent Application No. 2009-226148, filed Sep. 30, 2009, the contents of which are incorporated herein by reference.

BACKGROUND ART

In order to cool a semiconductor element such as a central processing unit (CPU) and the like, cooling tools such as heat sinks and heat pipes that are grounded on the semiconductor device are used. Moreover, increases in the amount of generated heat, and increases in the heat-generating area also create problems in high-function devices. A heat transfer path is formed between the ground plane of a cooling tool and a surface of the heat-generating element via a thin-film layer that is created mainly from a high polymer-based material known as a thermal interface material (TIM). Because of this, by fixing these two planes as parallel to each other as possible, efficient and uniform cooling of the element surfaces becomes possible. In actual fact, this type of cooling processing needs to occur in the limited space inside a device, and lop-sided contact and non-uniform temperature distribution arising from individual differences also create problems.

In modern high-function CPUs, there is a tendency for the amount of heat generated by the uptake of a graphic function or an interface function to increase continuously. Because of this, a high-performance cooling mechanism that is able to deal with an increasing amount of generated heat is being sought. Because the element surface area increases if a variety of functions get taken up, the heat transfer surface area increases, and this may be said to be beneficial for the cooling. However, in order to deal with portions where heat is generated in a localized manner, a structure is sought that makes it possible to uniformly cool the entire surface area to a greater extent than is currently the case. For example, in Patent document 1, a structure is described in which the heat sink fins are eliminated, and a direct collisional flow is supplied to the vicinity of the center of an element in which a particularly high cooling performance is required. In this structure, it is possible to supply cool air directly to the vicinity of the area around the center of the element, however, on the other hand, the fins have had to be removed from this area so that a trade-off occurs between this structure and the heat discharge efficiency provided by the fins.

Moreover, for example, in Patent document 2 a structure is proposed in which the pressure generation position of a clip that fixes the heat sink is located in the vicinity of the center of the heat sink. This structure makes it possible to reduce the heat resistance in the area of the TIM. However, the drawback of this structure is that the heat absorption is limited to the surface which is in contact with the element. The role of the distribution of the heat resistance in the TIM area is vital, and the effects thereof are known from the fact that, if the grounding balance is not uniform, then there is a considerable reduction in the heat resistance in areas where an abnormally high pressure is generated. Moreover, areas where an abnormally low pressure is generated are also created, and there is a considerable deterioration in the heat resistance in such areas. Because of this, in Patent document 2 a structure is proposed that, even if the contact balance is no longer equal, maintains a sizable contact pressure in the vicinity of the center of the element. However, the heat absorbing surface area during cooling is limited to the surface area of the element.

Furthermore, for example, in Patent document 3 a cooling structure is proposed that utilizes a cooling pipe. The cooling structure is fixed by a plate spring, and the force from this is generated in the vicinity of the center of the CPU. Because the heat absorption effect is greatest at the surface that is in contact with the heat pipe, the heat pipe is placed in the vicinity of the center of the CPU. The greatest efficiency is achieved by also causing the pressure from the plate spring to be generated in the center, however, in actual fact, because it is not possible to apply pressure to a hollow heat pipe, it is unavoidable for the pressure to be offset from the center by a corresponding amount.

PATENT DOCUMENTS

Patent document 1: Japanese Patent No. 3002611
Patent document 2: Japanese Unexamined Patent Application Publication No. 2002-516031
Patent document 3: Japanese Patent Application Laid-Open (JP-A) No. 2008-130037

DISCLOSURE OF INVENTION

However, in the above-described conventional electronic component cooling structures and electronic instruments in which they are mounted, problems such as increases in the amount of heat generated, increase in the heat-generating area, unevenness in the grounding balance of the cooling structure, and unevenness in the temperature distribution and the like have existed. Increases in the amount of heat generated and in the heat-generating surface area suggest an increase in the localized heat generation density, and there is a possibility that this will lead to a reduction in the device reliability, and an increase in the fan load and the like. In addition, there is a further possibility that these problems will lead to a deterioration in the grounding balance, and a deterioration in the temperature distribution inside the element.

As is described above, an improvement is currently being sought in the cooling performance of packages in which semiconductors that show a continuous increase in the amount of heat they generate are packaged.

By creating a cooling structure that utilizes the overall structure of a package, not only is an improvement in the cooling performance being sought, but an improvement in the grounding balance and a stabilization of the cooling performance by equalizing the temperature distribution within the element are also being sought.

MEANS FOR SOLVING THE PROBLEM

In order to solve the above described problems, a cooling structure for an electronic component and an electronic instrument having the following aspects are proposed.

A cooling structure for an electronic component according to a first aspect is a cooling structure for an electronic component having at least: a semiconductor element; a substrate on which the semiconductor element is packaged; a metal plate that is in contact via a thermal interface material with one surface of the semiconductor element and absorbs heat therefrom; and a heat pipe that is connected to the metal plate, wherein the metal plate is in contact via the thermal interface material with both the semiconductor element and the substrate.

It is also possible for a support point where a cooling tool which is formed by the metal plate and the heat pipe is fixed to the semiconductor element to be provided on the surface of the metal plate which faces the semiconductor element.

It is also possible for a support point where a cooling tool which is formed by the metal plate and the heat pipe is fixed to the semiconductor element to be provided on the surface of the metal plate which faces the substrate.

It is also possible for the heat pipe to be grounded on the surface of the metal plate which faces the semiconductor element.

It is also possible for the heat pipe to be grounded on the surface of the metal plate which faces the substrate.

It is also possible for the thermal interface material to be formed by a liquid or grease, and to be used to fill both a space between the semiconductor surface and the metal plate, and a space between the substrate surface and the metal plate.

It is also possible for the thermal interface material to be formed by a solid or a thermal conductive sheet, and to be used to fill both a space between the semiconductor surface and the metal plate, and a space between the substrate surface and the metal plate.

Moreover, an electronic instrument according to another aspect has the cooling structure for an electronic component described in each of the above aspects mounted thereon.

According to the cooling structure for an electronic component and the electronic instrument of the above described aspects, by placing the heat-absorbing surface of a cooling tool in contact with both the surface of a heat-generating element and the surface of a package substrate, it is possible to make the heat-receiving surface area larger than is the case conventionally, so that, as a result, it is possible to cool a package using an even smaller heat-resistance, and to thereby reduce the temperature and improve the reliability of a semiconductor element.

Moreover, by installing a heat pipe so as to utilize a large heat-absorbing surface area, it is possible to fix the support points which are used to fix a heat sink at points which are close to the center of the element. It is consequently possible to improve the installation balance, and improve the cooling performance in the vital area which is in the center of the element.

Furthermore, as a result of improving the installation balance, it is possible to provide a cooling structure having a more uniform temperature distribution within the element.

In addition, the heat pipe can be grounded having a low profile, so that the device can be made even slimmer.

BEST MODE FOR CARRYING OUT THE INVENTION

Several embodiments of a heat-transporting structure of an electronic instrument device will now be described. Note that these embodiments are intended to specifically explain the spirit and scope of the invention in order to provide a better understanding thereof, and, unless otherwise stated, are in no way intended to limit the invention. Moreover, in order to facilitate an understanding of the features of the invention, principal portions thereof may in some cases be enlarged in the drawings used in the following explanation, and the dimensional proportions and the like of the respective component elements depicted therein may differ from their actual sizes.

First Embodiment

Figure 1:
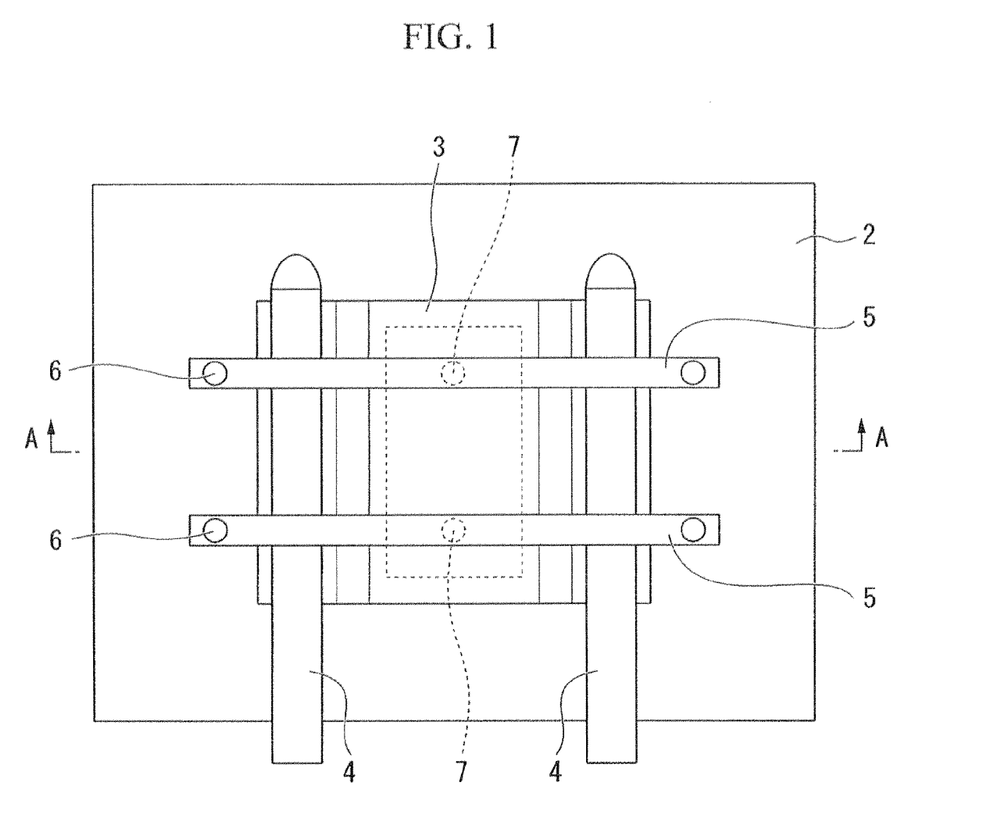
FIG. 1 is a plan view showing the cooling structure of an electronic component of a first embodiment.
Figure 2:
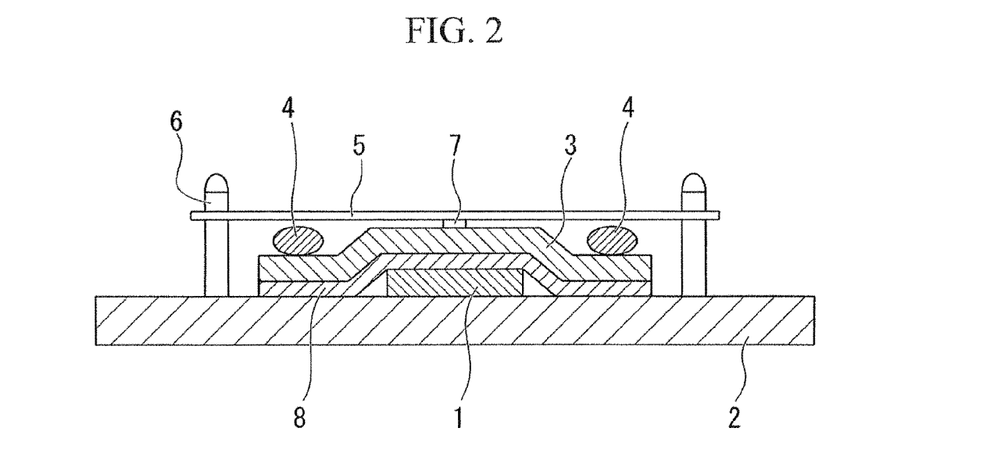
FIG. 2 is a cross-sectional view taken along a line A-A in FIG. 1.

FIG. 1 is a plan view showing a cooling structure of an electronic instrument of a first embodiment, FIG. 2 is a cross-sectional view taken along a line A-A in FIG. 1.

Here, a semiconductor package obtained by packaging a 10 mm by 20 mm rectangular semiconductor element on an approximately 40 mm square substrate is used as an example. In FIG. 1 and FIG. 2, 1 denotes a semiconductor element, 2 is a substrate, 3 is a metal plate, 4 is a heat pipe, 5 is a plate spring, 6 is a fastening screw, 7 is a fixing support point, and 8 is a thermal interface material.

In the cooling structure for an electronic component, a center portion of the metal plate 3 that forms the heat-absorbing surface protrudes so as to correspond to the size of the semiconductor element 1. The fixing support points 7 that are used to fix the plate springs 5 are provided in the center of this protruding plate, and fix the plate springs 5 on all sides. Because the grounding pressure is applied via the single point of each fixing support point, any tilting of the heat-absorbing surface relative to the surface of the heat-generating element is kept to a minimum. The heat pipes 4 are provided around the periphery such that they enclose the protruding area from the outside.

According to this type of structure, by increasing the heat-absorbing surface area of the cooling tool, the cooling performance is improved. By placing the point where the grounding pressure of the cooling tool is generated directly above the heat-generating element, the grounding pressure in the center of the element can be maintained at a high level, and it becomes possible to obtain a stable cooling effect.

Second Embodiment

Figure 3:
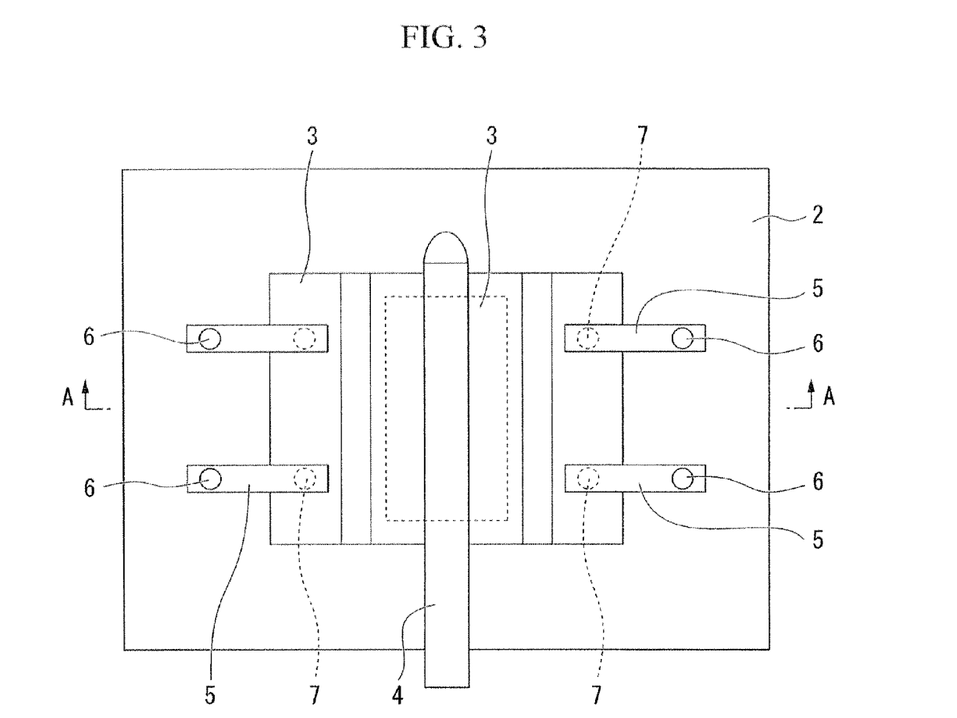
FIG. 3 is a plan view showing the cooling structure of an electronic component of a second embodiment.
Figure 4:
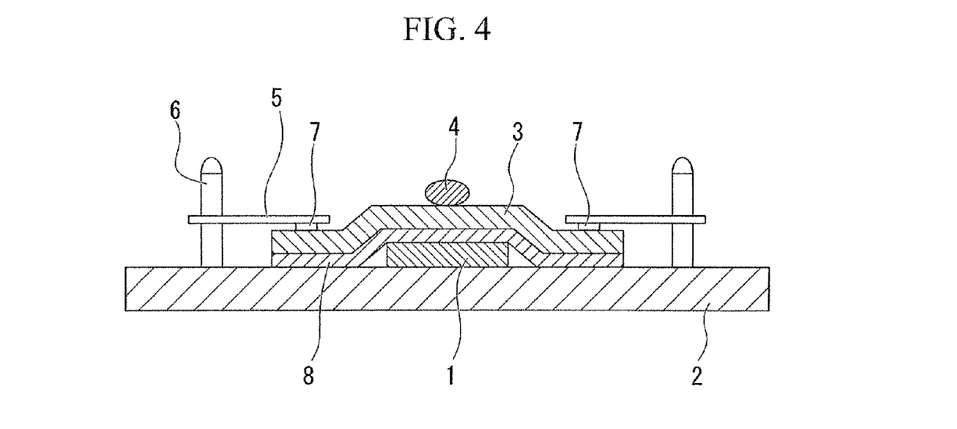
FIG. 4 is a cross-sectional view taken along a line A-A in FIG. 3.

FIG. 3 is a plan view showing a cooling structure of an electronic instrument of a second embodiment, FIG. 4 is a cross-sectional view taken along a line A-A in FIG. 3. This embodiment provides an example in which, by installing the fixing plate springs 5 in areas where they are in contact with the substrate 2, the heat pipe 4 can be superimposed on top of the semiconductor element 1.

Third Embodiment

Figure 5:
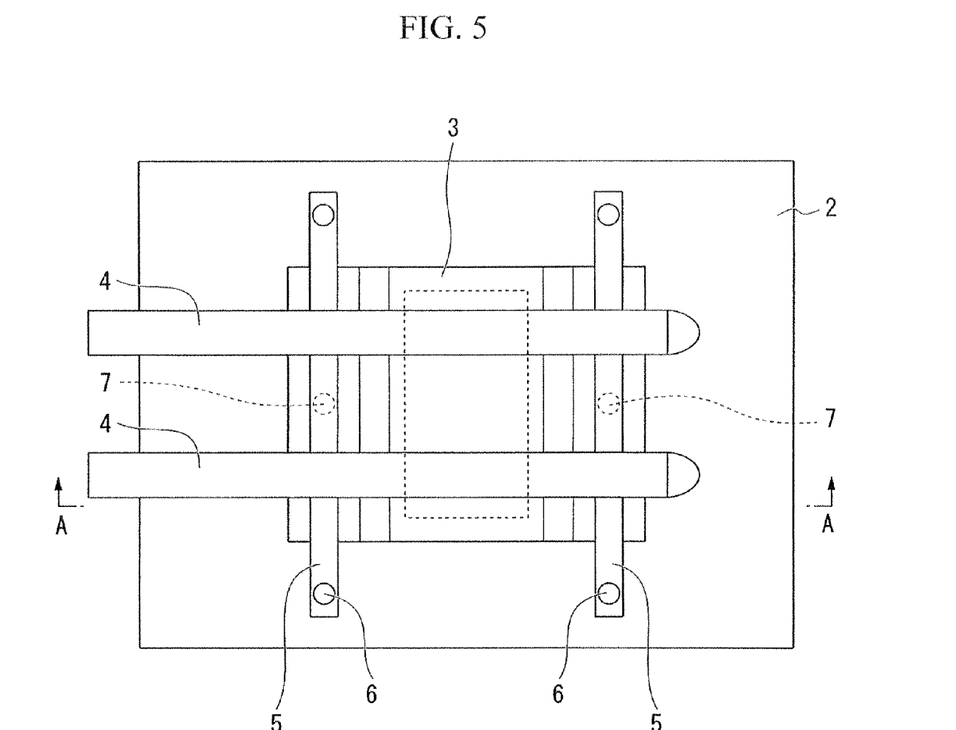
FIG. 5 is a plan view showing the cooling structure of an electronic component of a third embodiment.
Figure 6:
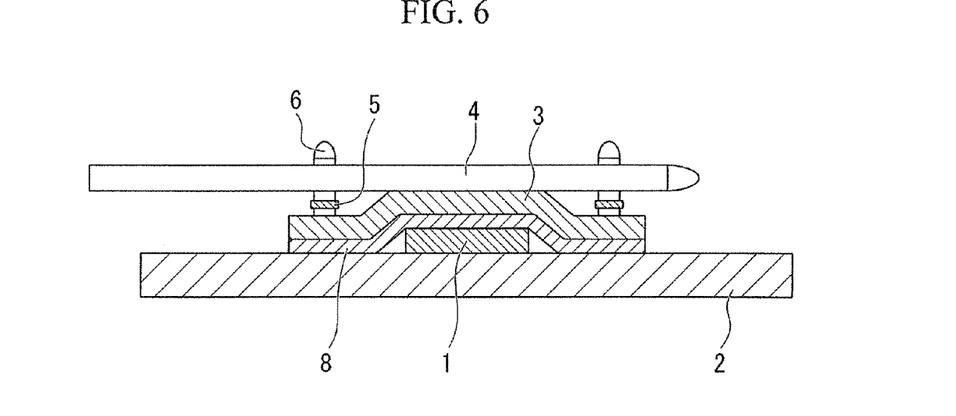
FIG. 6 is a cross-sectional view taken along a line A-A in FIG. 5.

FIG. 5 is a plan view showing a cooling structure of an electronic instrument of a third embodiment, FIG. 6 is a cross-sectional view taken along a line A-A in FIG. 5.

This embodiment provides an example in which two heat pipes 4 are arranged such that they extend in a direction which orthogonally intersects the direction of the long sides of the semiconductor element 1.

Fourth Embodiment

Figure 7:
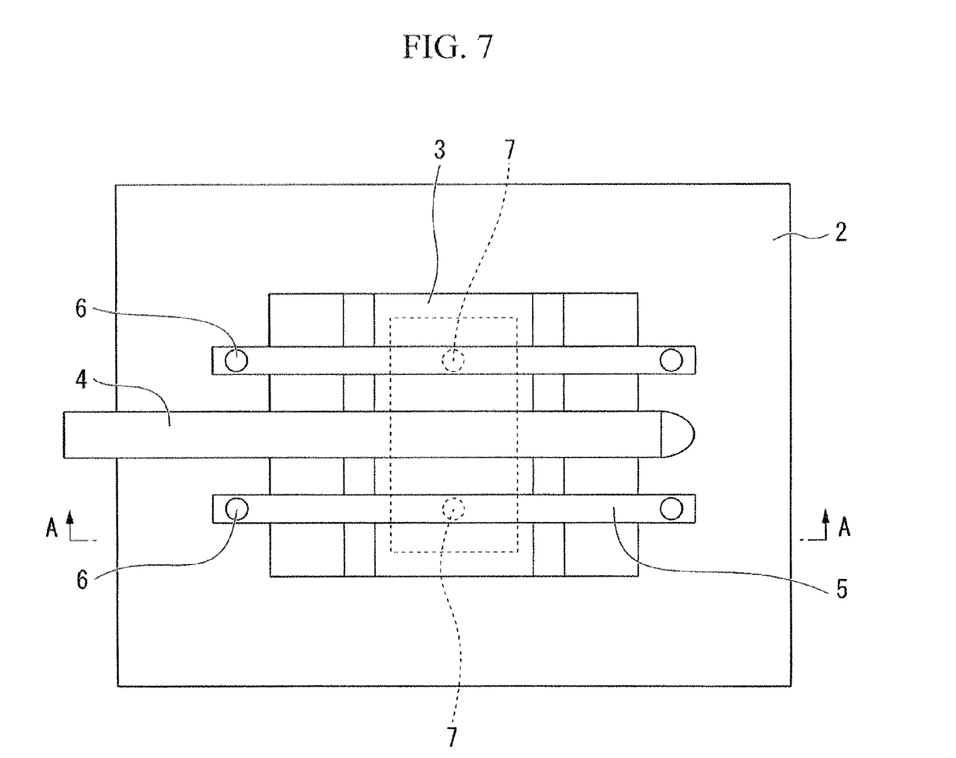
FIG. 7 is a plan view showing the cooling structure of a electronic component of a fourth embodiment.
Figure 8:
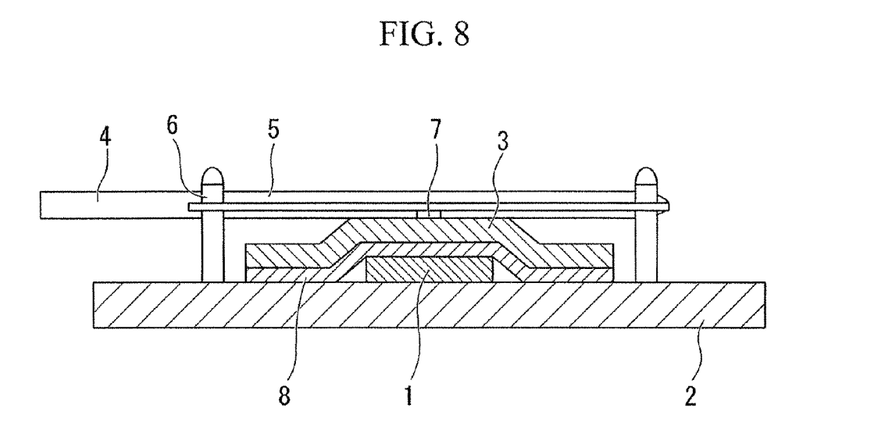
FIG. 8 is a cross-sectional view taken along a line A-A in FIG. 7.

FIG. 7 is a plan view showing a cooling structure of an electronic instrument of a fourth embodiment, FIG. 8 is a cross-sectional view taken along a line A-A in FIG. 7. This embodiment provides an example in which a single heat pipe 4 and the plate springs 5 are arranged in parallel with each other such that they extend in a direction which orthogonally intersects the direction of the long sides of the semiconductor element 1.

Fifth Embodiment

Figure 9:
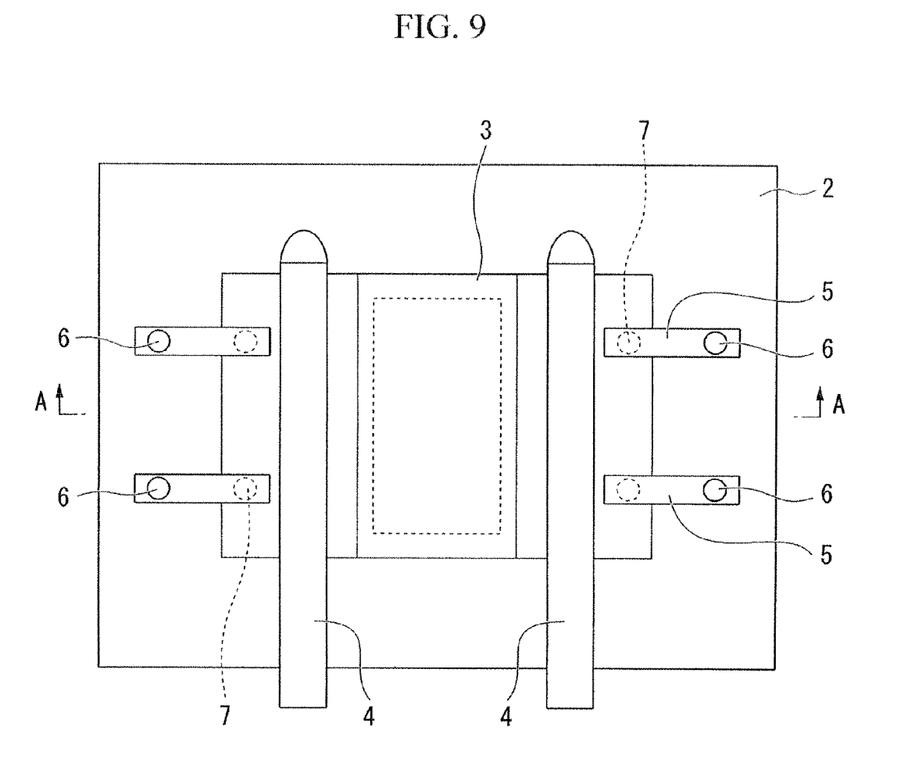
FIG. 9 is a plan view showing the cooling structure of an electronic component of a fifth embodiment.
Figure 10:
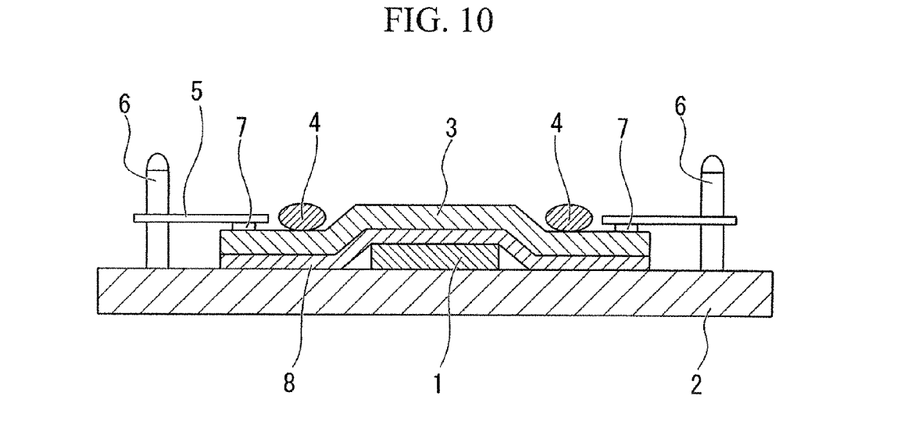
FIG. 10 is a cross-sectional view taken along a line A-A in FIG. 9.

FIG. 9 is a plan view showing a cooling structure of an electronic instrument of a fifth embodiment, FIG. 10 is a cross-sectional view taken along a line A-A in FIG. 9. This embodiment provides an example in which the plate springs 5 are installed in areas where they are in contact with the substrate 2, and two heat pipes 4 are formed on both sides such that they are not superimposed on top of the semiconductor element 1.

Sixth Embodiment

Figure 11:
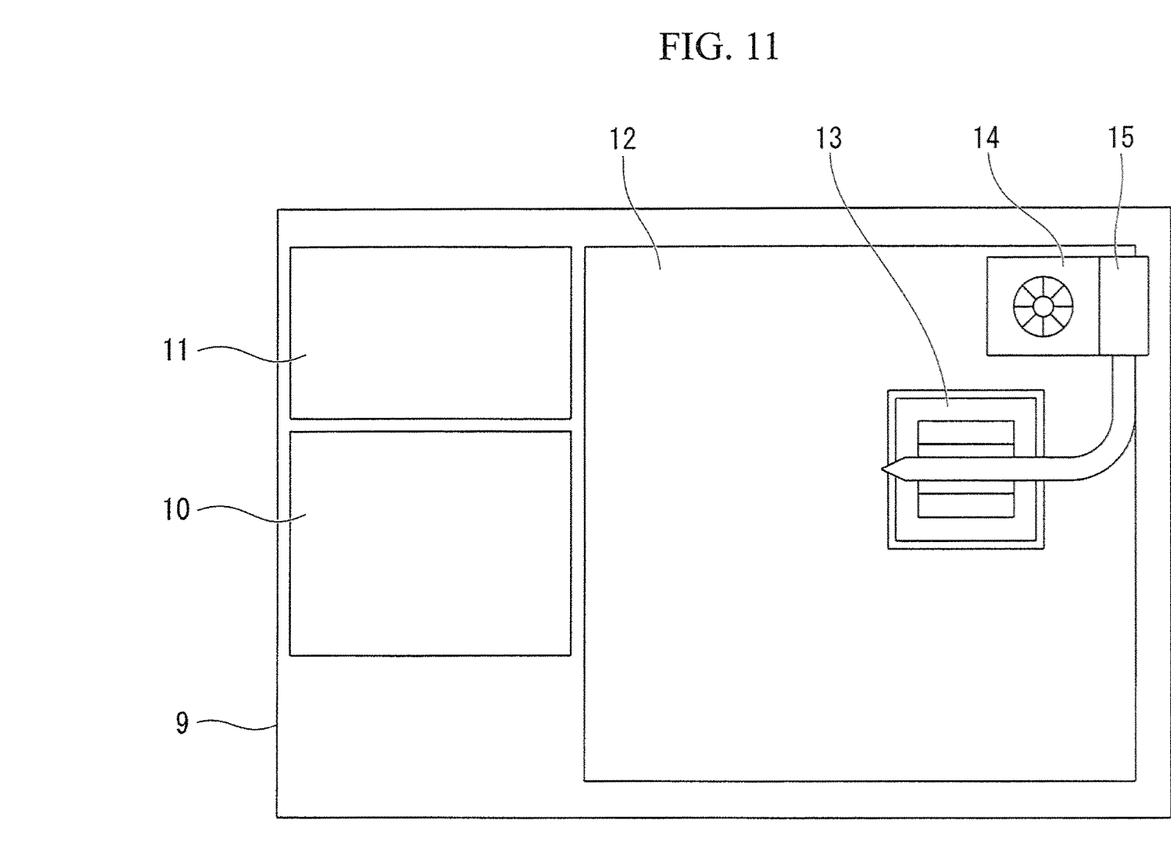
FIG. 11 is a plan view showing an example of an electronic instrument.

FIG. 11 is a plan view showing an example of an electronic instrument.
In FIG. 11, 9 denotes a personal computer body, 10 is a hard disk drive, 11 is a DVD drive, 12 is a substrate, 13 is a CPU package, 14 is a fan, and 15 denotes heat discharge fins.

According to this type of structure, when grounding pressure is generated by means of a plate spring structure, a low-profile cooling structure can be created, however, conventionally, the height thereof has been limited to the height of the heat pipe that is grounded directly above the heat-generating element. According to the above-described embodiments, the heat pipe can be can be grounded on a package substrate that is even lower in height, so that the overall package including the cooling structure can be made low-profile. This contributes to even greater miniaturization of electronic instruments such as mobile terminals and the like that are already highly miniaturized.

Note that in each of the above-described embodiments, the thermal interface material 8 may also be a liquid or a grease. Alternatively, the thermal interface material 8 may be a solid or a thermal conductive sheet.

INDUSTRIAL APPLICABILITY

Examples of practical applications of the above-described embodiments include their use in semiconductor devices in all electronic instruments, notebook and desktop-type PCs, work stations, and servers and the like that require cooling.

BRIEF DESCRIPTION OF THE DRAWINGS

1 . . . Semiconductor element
2 . . . Substrate
3 . . . Metal plate
4 . . . Heat pipe
5 . . . Plate spring
6 . . . Fastening screw
7 . . . Fixing support point
8 . . . Thermal interface material
9 . . . Personal computer body
10 . . . Hard disk drive
11 . . . DVD drive
12 . . . Substrate
13 . . . CPU package
14 . . . Fan
15 . . . Heat discharge fins

The invention claimed is:

1. An electronic component comprising:
a semiconductor element;
a substrate on which the semiconductor element is packaged;
a metal plate that is in contact via a thermal interface material with one surface of the semiconductor element and absorbs heat therefrom; and
at least a pair of heat pipes connected to the metal plate,
wherein the metal plate is in contact via the thermal interface material with both the semiconductor element and the substrate; the metal plate is in contact via the thermal interface material with the substrate at least two locations on peripheral sides of the semiconductor element.

2. The electronic component according to claim 1, wherein a support point where a cooling tool which is formed by the metal plate and the at least one pair of heat pipes are fixed to the semiconductor element is provided on the surface of the metal plate which faces the semiconductor element.

3. The electronic component according to claim 1, wherein a support point where a cooling tool which is formed by the metal plate and the at least one pair of heat pipes are fixed to the semiconductor element is provided on the surface of the metal plate which faces the substrate.

4. The electronic component according to claim 1, wherein the at least one pair of heat pipes are grounded on the surface of the metal plate which faces the semiconductor element.

5. The electronic component according to claim 1, wherein the at least one pair of heat pipes are grounded on the surface of the metal plate which faces the substrate.

6. The electronic component according to claim 1, wherein the thermal interface material is formed by a liquid or a grease, and is used to fill both a space between the semiconductor surface and the metal plate, and a space between the substrate surface and the metal plate.

7. The electronic component according to claim 1, wherein the thermal interface material is formed by a solid or a thermal conductive sheet, and is used to fill both a space between the semiconductor surface and the metal plate, and a space between the substrate surface and the metal plate.

8. An electronic instrument in which the electronic component according to claim 1 is mounted.

9. An electronic instrument in which the electronic component according to claim 6 is mounted.

10. An electronic instrument in which the electronic component according to claim 7 is mounted.

11. The electronic component according to claim 1, wherein a first heat pipe of the pair of heat pipes is attached to the metal plate on a first side of the semiconductor element, and
wherein a second heat pipe of the pair of heat pipes is attached to the metal plate on a second side of the semiconductor element.

12. The electronic component according to claim 11, wherein the first side of the semiconductor element is axially opposite to the second side of the semiconductor element.

13. The electronic component according to claim 1, wherein the metal plate has a protrusion area formed at a center portion of the metal plate so as to correspond to a size of the semiconductor element and absorbs heat therefrom.

14. The electronic component according to claim 13, wherein the pair of heat pipes are provided around a periphery of the protrusion area such that the pair of pipes enclose the protruding area from an outside.

15. The electronic component according to claim 13, wherein a support point where a cooling tool which is formed by the metal plate and the pair of heat pipes are fixed to the semiconductor element is provided on a center of the protrusion area of the metal plate.

16. The electronic component according to claim 1, wherein the pair of heat pipes are arranged to extend in a direction which orthogonally intersects a direction of long sides of the semiconductor element.

\* \* \* \* \*